United States Patent [19]

Tokushige

[11] Patent Number: 5,443,396
[45] Date of Patent: Aug. 22, 1995

[54] IC SOCKET

[75] Inventor: Yutaka Tokushige, Kawaguchi, Japan

[73] Assignee: Enplas Corporation, Japan

[21] Appl. No.: 209,828

[22] Filed: Mar. 11, 1994

[30] Foreign Application Priority Data

Mar. 31, 1993 [JP] Japan .............................. 5-015866 U

[51] Int. Cl.⁶ .............................................. H01R 11/22
[52] U.S. Cl. ................... 439/266; 439/331; 439/70
[58] Field of Search ..................... 439/64, 68, 69, 73, 439/263, 264, 266, 269, 331, 330

[56] References Cited

U.S. PATENT DOCUMENTS

| 4,691,975 | 9/1987 | Fukunaga et al. | 439/266 |
| 4,872,850 | 10/1989 | Mogi et al. | 439/266 |
| 5,108,302 | 4/1992 | Pfaff | 439/266 |

FOREIGN PATENT DOCUMENTS 64-65782  3/1989  Japan .
5-24352  3/1993  Japan .

Primary Examiner—Larry I. Schwartz
Assistant Examiner—Hien D. Vu
Attorney, Agent, or Firm—Graham & James

[57] ABSTRACT

An IC socket includes a socket body, a cover having a cam surface and capable of moving vertically, and resilient contact pins provided in the socket body, each having an engaging portion which is capable of engaging the cam surface and a contact portion which is capable of contacting each of lead terminals of an IC package. Each contact pin is provided with a resiliently forced pin having an engagement working portion which can engage the cam surface and can also engage the engaging portion. When the cover is depressed, the engagement working portion is moved outwardly, against its resilience, because of engagement with the cam surface. Conversely, when the cover is not pressed, the engagement working portion resiliently engages the engaging portion and forcedly presses the contact portion inwardly. Thus, the IC socket can securely remove oxidation films with which the surfaces of lead terminals of the IC package are covered, with a resultant good electrical connection.

3 Claims, 4 Drawing Sheets

IC SOCKET

BACKGROUND OF THE INVENTION

1. Field of the Invention

This invention relates to an IC socket for obviating an electrical connection failure by removing oxidation films with which the surfaces of lead terminals of an IC package are covered.

2. Description of Related Art

An open top type of IC socket in prior art has a structure such as that shown in FIG. 1. In this figure, reference numeral 1 represents an IC socket body; 2 a cover urged upwardly by a resilient member, not shown, and mounted to the IC socket body so as to be able to move vertically; and 2a a cam surface of the cover 2. Reference numeral 3 denotes a plurality of contact pins arranged in the socket body 1; 3a an engaging portion of each contact pin 3; 3b a contact portion of each contact pin 3; and 3c a spring portion of each contact pin 3. Numeral 4 designates an IC package and 5 designates lead terminals of the IC package 4.

Thus, in the conventional IC socket, when the cover 2 is pressed downwardly, the cam surface 2a of the cover 2 acts on the engaging portion 3a of each contact pin 3 so that the upper section of the contact pin 3 including the contact portion 3b moves in an outward direction relative to the IC socket body 1. This allows the IC package 4 to be mounted on the IC socket body 1. Subsequently, when the pressure of the cover 2 is relieved after the mounting of the IC package 4, the contact portion 3b returns to its original position by virtue of a resilient bias force of the spring portion 3c and comes in contact with each of the lead terminals 5 of the IC package 4 in such a manner as to press it down. In this process, the contact portion 3b slides slightly on the surface of each lead terminal 5 and removes an oxidation film with which the surface of the lead terminal 5 is covered, thus providing the electrical connection between the contact pin 3 and the lead terminal 5.

The distance over which the contact portion 3b slides, however, is very short, and therefore the oxidation film with which the surface of the lead terminal 5 is coated cannot be securely removed. This often causes the failure of the electrical connection between the lead terminal 5 and the contact portion 3b. Further, since the contact portion 3b is constructed so that its slide distance is very short, cases have arisen in which it does not entirely slide on the lead terminal 5.

SUMMARY OF THE INVENTION

It is, therefore, an object of the present invention to provide an open top type of IC socket in which when the IC package is mounted to the IC socket, the contact portions of the contact pins of the IC socket slide on the lead terminals of the IC package, thereby removing securely oxidation films with which the surfaces of the lead terminals are covered and being capable of obviating an electrical connection failure.

In order to achieve this object, the IC socket according to the present invention includes a socket body; a cover having a cam surface and provided to be able to move vertically with respect to the socket body; and resiliently deformable contact pins arranged in the socket body, each having an engaging portion which is capable of engaging the cam surface of the cover and a contact portion which is capable of making contact with each lead terminal of the 1C package mounted to the socket body. Each of the contact pins is provided with a resiliently deformable forced pin having an engagement working portion, adjacent to the engaging portion, which can engage the engaging portion as well as the cam surface of the cover. When the cover is pressed downwardly, the engagement working portion shifts in an outward direction relative to the socket body, against its resilience, because of engagement with the cam surface, to relieve pressure caused by engagement with the engaging portion of the contact pin. Conversely, when the cover is not pressed, the engagement working portion is designed to release the engagement with the cam surface and to resiliently engage the engaging portion or the contact pin, thus pressing and moving forcedly the contact portion of the contact pin in an inward direction relative to the socket body.

In this way, only by mounting the IC package to the IC socket, it is possible to securely remove oxidation films with which the surfaces of the lead terminals of the IC package are coated and to obviate the failure of the electrical connection between each lead terminal of the IC package and each contact pin of the IC socket.

This and other objects as well as the features and advantages of the present invention will become apparent from the following detailed description of the preferred embodiments when taken in conjunction with the accompanying drawings.

DETAILED DESCRIPTION OF THE PREFERRED EMBODIMENTS

Figure 1:
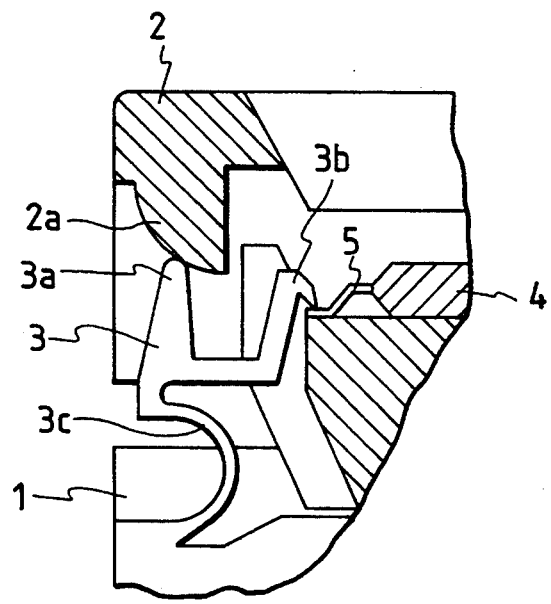
FIG. 1 is a view showing the structure of an open top type of IC socket in the prior art.
Figure 2:
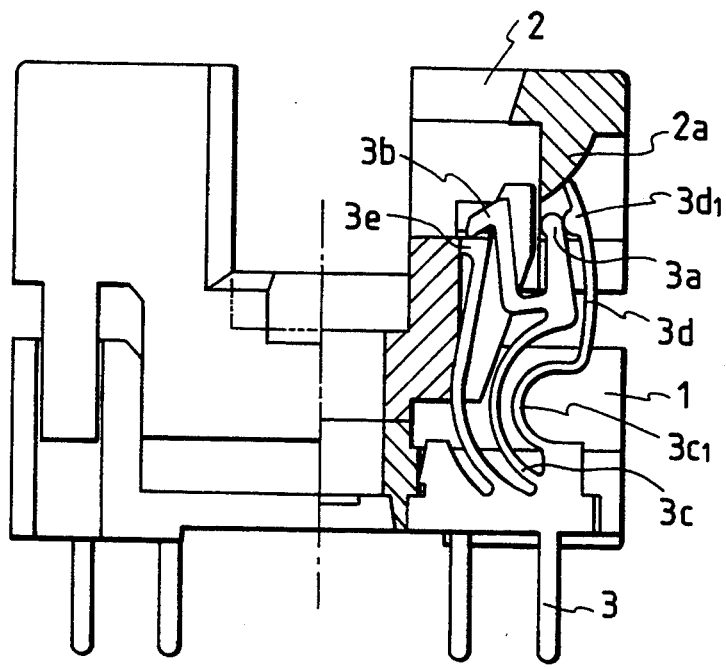
FIG. 2 is a partially sectional view showing an embodiment of an open top type of IC socket according to the present invention.
Figure 3:
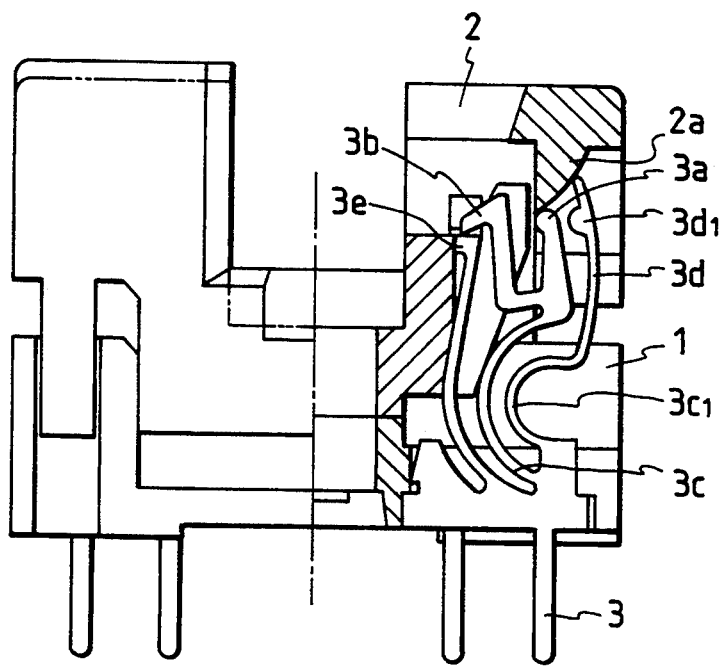
FIG. 3 is a partially sectional view showing a first pressure state where a cover of the IC socket shown in FIG. 2 is slightly pressed downwardly.
Figure 4:
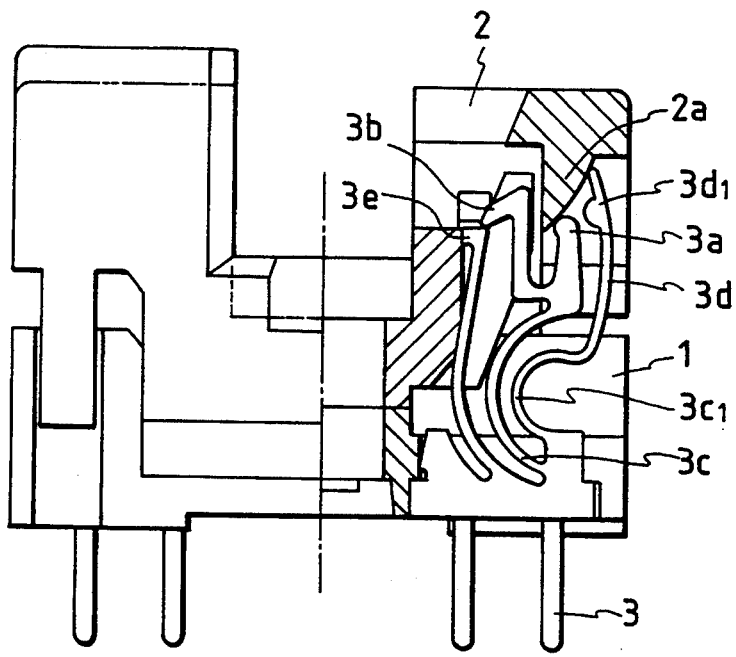
FIG. 4 is a partially sectional view showing a second pressure state where the cover of the IC socket shown in FIG. 3 is further pressed downwardly.
Figure 5:
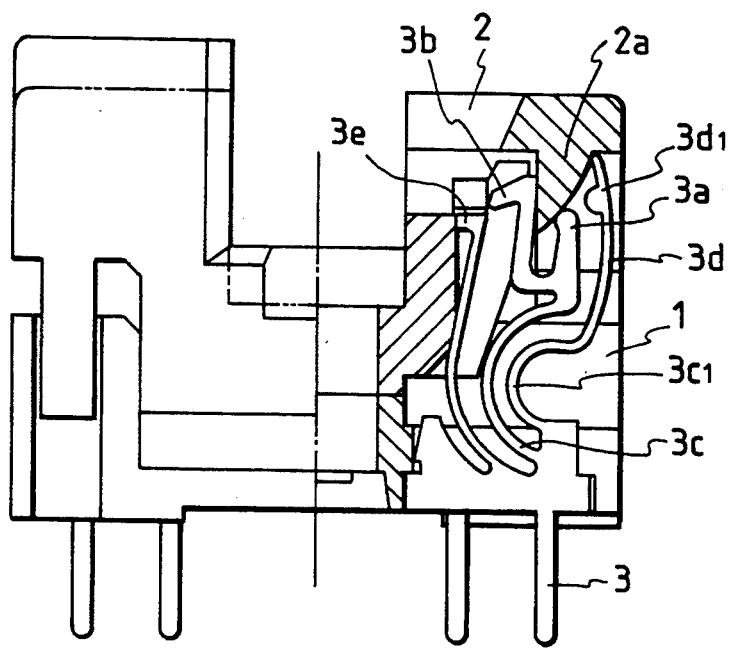
FIG. 5 is a partially sectional view showing a third pressure state where the cover of the IC socket shown in FIG. 2 is completely pressed downwardly.

In accordance with FIGS. 2 though 8, the embodiments of the present invention will be explained in detail below. In these figures, like reference numerals are used to indicate like members with the prior art shown in FIG. 1. FIG. 2 shows a state where the cover is not pressed. FIGS. 3 and 4 show, in regular sequence, intermediate states between FIG. 2 and FIG. 5 which shows a state where the cover is pressed to the lowest position.

Each contact pin 3 in this embodiment has a characteristic structure which is different from that of the prior art. Reference numeral 3d designates a forced pin having an engagement working portion 3d1 to be engaged with as the engaging portion 3a, having an upper end portion which is engaged with the cam surface 2a of the cover 2, and provided for increasing the resilient bias force of the engaging portion 3a; 3c1 a spring portion provided for exerting the resilient force of the forced pin 3d; and 3e a receiver for supporting the under surface of each lead terminal 5.

Figure 6:
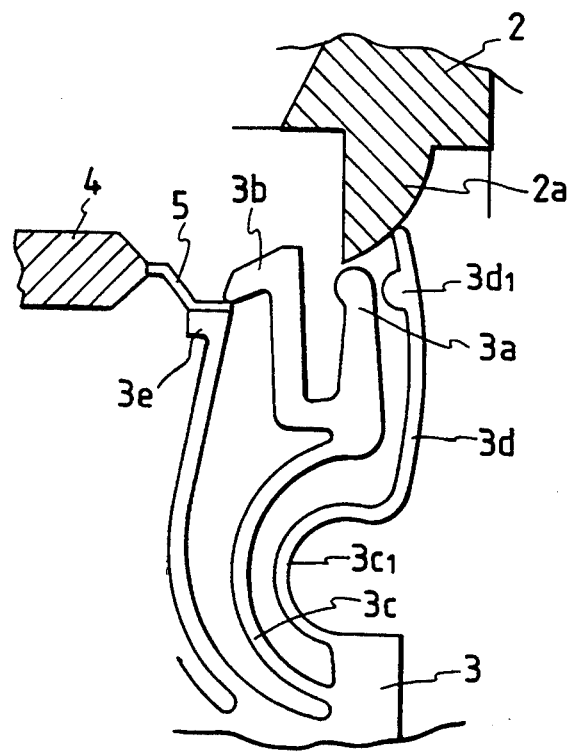
FIG. 6 is an enlarged sectional view showing a state brought about immediately after an IC package Is mounted in the state of FIG. 5 in the embodiment of the present invention and then the pressure of the cover is relieved.

The IC socket according to the present invention is constructed as mentioned above. When the cover 2 is pressed downwardly, the engaging portion 3a of the contact pin 3 and the engagement working portion 3d1 of the forced pin 3d which engage the cam surface 2a of the cover 2 are urged to move in an outward direction with respect to the IC socket body 1, and the spring portions 3c and 3c1 are resiliently deformed. The contact portion 3b also moves to the outward direction relative to the IC socket body 1 (refer to FIGS. 2 through 5). In this state, when the IC package 4 is mounted to the IC socket body 1 and the pressure of the cover 2 is relieved, as depicted in FIG. 6, the contact portion 3b comes first in contact with the surface of the lead terminal 5. Subsequently, the engaging portion 3a is strongly pressed by the action of the forced pin 3d holding its resilient bias force in the spring portion 3c1, In addition to the resilient bias force of the engaging portion 3a stored in the spring portion 3c. Because of its operation, the contact portion 3b slides strongly over a distance longer than in the prior art, with its tip contacting the surface of the lead terminal 5. That is, the engagement working portion 3d1 pushes up the cover 2 by virtue of the biasing force of the spring portion 3c1 to force the engaging portion 3a inwardly. This action makes it possible to securely remove the oxidation film with which the surface of the lead terminal 5 is covered in a relatively wide range, and to realize a complete electrical connection between the lead terminal 5 and the contact pin 3 (refer to FIG. 7).

The forced pin 3d may well be designed independent of the contact pin 3. Further, it is also possible to make designs in such a way that, instead of the forced pin 3d, the contact portion 3b is strongly pushed back in an inward direction relative to the socket body. Although the IC socket according to the present invention is constructed so that each lead terminal 5 of the IC package 4 is clamped between the contact portion 3b and the receiver 3e, the present invention is also applicable to the open top type of IC socket in which the receiver 3e is not provided, as shown In FIG. 1.

Figure 8:
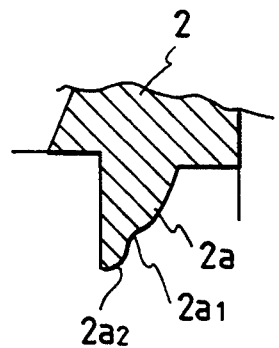
FIG. 8 is a view for explaining another embodiment of the present invention.
Figure 7:
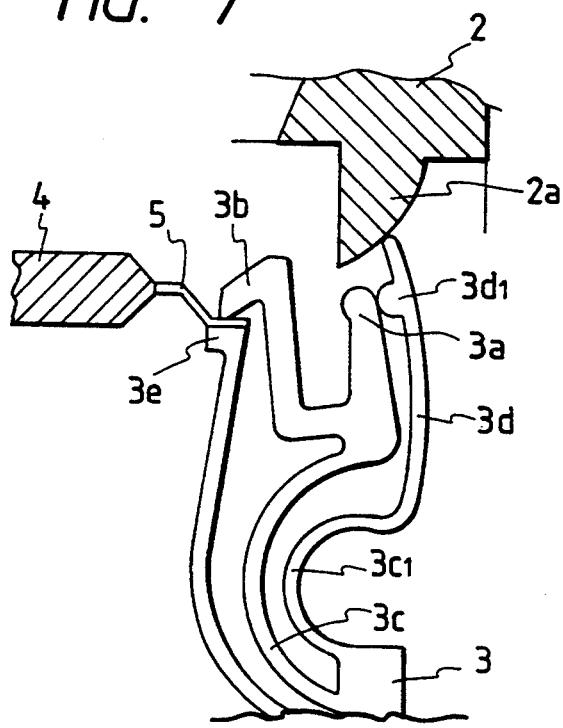
FIG. 7 is an enlarged sectional view showing a state where a complete electrical connection between each contact pin of the IC socket and each lead terminal of the IC package in the embodiment of the present invention has been established.

The engaging portion 3a can cause the contact portion 3b to slide inwardly and outwardly in accordance with the configuration of the cam surface 2a of the cover 2. Specifically, as shown in FIG. 8, the cam surface 2a is provided with concave and convex portions 2a1 and 2a2, and after the pressure of the cover 2 is relieved, the engaging portion 3a fails into the concave portion 2a1 to bias the contact portion 3b inwardly by its resilience. Subsequently, the engaging portion 3a, when reaching the convex portion 2a2, tends to return to its original position by itself and eventually, as shown in FIG. 7, can further bias the contact portion 3b inwardly with the aid of the forced pin 3d.

What is claimed is:

1. An IC socket comprising:
   a socket body;
   a cover having a cam surface, for moving vertically with respect to said socket body; and
   contact pins which are resiliently deformable and provided in said socket body, each having an engaging portion for engaging the cam surface of said cover and a contact portion for contacting each of lead terminals of an IC package mounted to said socket body,
   wherein each of said contact pins further comprises a forced pin which is resiliently deformable and arranged adjacent to the engaging portion of each of said contact pins, said forced pin having an upper end portion which is engaged with the cam surface of said cover and also having an engagement working portion for engaging the engaging portion of each of said contact pins, so that when said cover is pressed downwardly, the engagement working portion of said forced pin moves outwardly relative to said socket body against resilience of said forced pin because the upper end portion of said forced pin is engaged with the cam surface of said cover, and as a result, the engagement working portion of said forced pin disengages from the engaging portion of each of said contact pins thereby reducing pressure on the engaging portion of each of said contact pins caused by the resilience of said forced pin, and so that while said cover is released, the engaging portion of each of said contact pins is disengaged from the cam surface of said cover and the engagement working portion of said forced pin is resiliently engaged with the engaging portion of each of said contact pins, thus pressing and moving forcedly the contact portion of each of said contact pins in an inward direction relative to said socket body.

2. An IC socket according to claim 1, wherein said forced pin is constructed independently of each of said contact pins.

3. An IC socket according to claim 1, wherein the cam surface of said cover has concave and convex portions.

* * * * *